United States Patent [19]

Weng

[11] Patent Number: 5,710,782
[45] Date of Patent: Jan. 20, 1998

[54] SYSTEM FOR CORRECTION OF THREE AND FOUR ERRORS

[75] Inventor: Lih-Jyh Weng, Shrewsbury, Mass.

[73] Assignee: Quantum Corporation, Milpitas, Calif.

[21] Appl. No.: 580,351

[22] Filed: Dec. 28, 1995

[51] Int. Cl.$^6$ .................................................... H03M 13/00
[52] U.S. Cl. .................................................... 371/37.1
[58] Field of Search .................................................... 371/37.1

[56] References Cited

U.S. PATENT DOCUMENTS

| | | | |
|---|---|---|---|
| 4,099,160 | 7/1978 | Flagg | 371/37.1 |
| 4,567,594 | 1/1986 | Deodhar | 371/40.1 |
| 4,839,896 | 6/1989 | Glover et al. | 371/37.8 |

Primary Examiner—Stephen M. Baker
Attorney, Agent, or Firm—Cesari and McKenna, LLP

[57] ABSTRACT

A system determines the error locations of four errors in $GF(2^{2m})$ by transforming a degree-four error locator polynomial ultimately into two quadratic equations, finding the solutions of these equations, and from these solutions determining the roots of an error locator polynomial. The system first manipulates the error locator polynomial, which is of the form:

$$\sigma(x)=\sigma_4 x^4+\sigma_3 x^3+\sigma_2 x^2+\sigma_1 x+\sigma_0 \qquad [1]$$

into the form:

$$\theta(y)=y^4+\theta_2 y^2+\theta_1 y+\theta_0 \qquad [2]$$

where the $\theta_i$'s are combinations of the coefficients of the terms of the error locator polynomial. The system has thus produced an equation in which the coefficient of the $y^3$ term is 0. The system then factors $\theta(y)$, to produce $$\theta(y)=(y^2+t^*y+u)^*(y^2+v^*y+w), \qquad [3]$$

where "*" represents multiplication. It then determines the values of t, u, v and w by equating the coefficients of the two expressions for $\theta(y)$ and solving first for the variable t, which is equal to v, and then for the variables w and u. Once the values of the variables are determined, the system solves two quadratic equations, one for each of the factors of equation 3. Based on these solutions, the system determines the four error locations associated with the degree-four error locator polynomial.

6 Claims, 6 Drawing Sheets

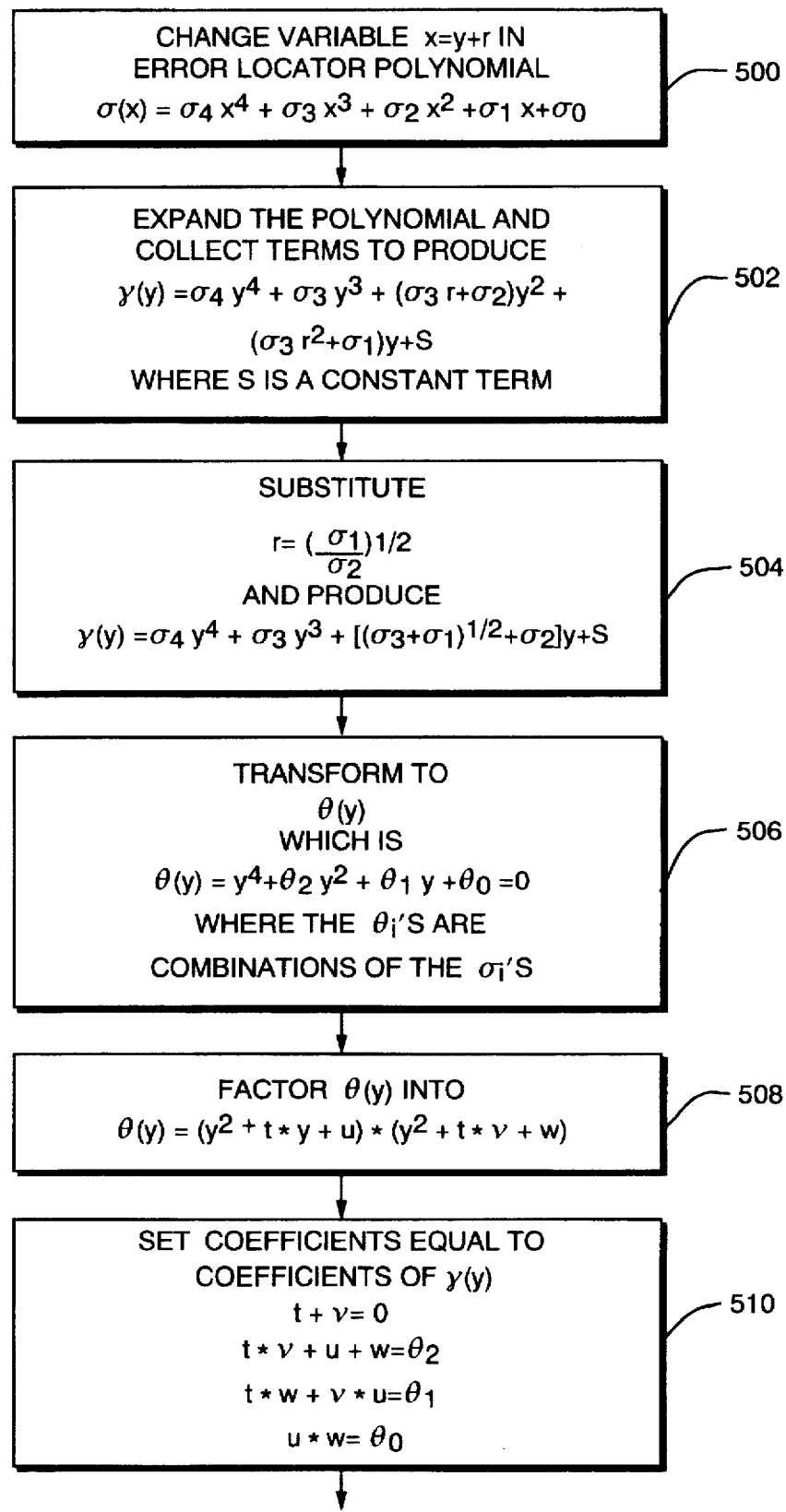
FIG. 5A           TO FIG. 5B

SYSTEM FOR CORRECTION OF THREE AND FOUR ERRORS

FIELD OF THE INVENTION

This invention relates generally to data processing systems and, more particularly, to a system for decoding and correcting errors in data using an error correction code.

BACKGROUND OF THE INVENTION

Data stored on magnetic media, such as a magnetic disks, are typically stored in encoded form, so that errors in the stored data can possibly be corrected. The errors may occur, for example, because of inter-symbol interference, a defect in the disk, or noise. As the density of the data stored on the disk increases, more errors are likely, and the system is required to correct greater numbers of errors. The speed with which the system corrects the errors is important to the overall speed with which the system processes the data.

Prior to recording, multiple-bit data symbols are encoded using an error correction code (ECC). When the data symbols are retrieved from the disk and demodulated, the ECC is employed to, as the name implies, correct the erroneous data.

Specifically, before a string of k data symbols is written to a disk, it is mathematically encoded using an (n, k) ECC to form n-k ECC symbols. The ECC symbols are then appended to the data string to form an n-symbol error correction code word, which is then written to, or stored, on the disk. When the data are read from the disk, the code words containing the data symbols and ECC symbols are retrieved and mathematically decoded. During decoding, errors in the data are detected and, if possible, corrected through manipulation of the ECC symbols [for a detailed description of decoding see, Peterson and Weldon, *Error Correction Codes*, 2nd Ed. MIT Press, 1972].

To correct multiple errors in strings of data symbols, the system typically uses an ECC that efficiently and effectively utilizes the various mathematical properties of sets of symbols known as Galois fields. Galois fields are represented "GF ($P^m$)", where "P" is a prime number and "m" can be thought of as the number of digits, base "P", in each element or symbol in the field. P usually has the value 2 in digital computer and disk drive applications and, therefore, m is the number of bits in each symbol. The ECC's commonly used with the Galois Fields are Reed Solomon codes or BCH codes.

There are essentially four major steps in decoding a corrupted code word of a Reed-Solomon code or a BCH code. The system first determines error syndromes that are based on the results of a manipulation of the ECC symbols. Next, using the error syndromes, the system determines an error locator polynomial, which is a polynomial that has the same degree as the number of errors. The system then finds the roots of the error locator polynomial and from each root determines the location of an associated error in the code word. Finally, the system finds error values for the error locations. In binary systems, such as digital computers, there is only one possible error value for an error location, and thus, the step of determining error values is trivial.

The steps of determining the syndromes and finding the error locations are the most time consuming in the error correction process. The invention described herein reduces the time it takes the error correction system to find the locations of either three or four errors. This involves finding the roots of third and fourth degree error locator polynomials.

In prior systems, the roots of degree-four polynomials are determined by trial and error, or by matrix manipulation or look-up table. The trial and error method is performed by substituting into the polynomial every possible value, i.e., every element of the applicable GF($2^{2m}$) that is associated with a code word location, and for each value evaluating the polynomial. If the polynomial equals zero for a given value, the value is a root. The system continues the trial and error process by substituting a next possible value into the polynomial and determining if that value is a root; and so forth, until either all possible values have been tried or all four roots are determined. This trial and error process, which in an optimized form is commonly known as a Chien Search, is time consuming. Further, the time is unpredictable, since it varies with the locations of the errors in the code words.

The matrix manipulation and look-up table methods involve transforming a general degree-four polynomial of the form:

$$\sigma_4 x^4 + \sigma_3 x^3 + \sigma_2 x^2 + \sigma_1 x + \sigma_0$$

into a polynomial of the form:

$$x^4 + x^2 + ax + b.$$

If a look-up table is used, the table contains a set of solutions for every possible set of values of a and b. For the ECCs used today, typically over GF($2^8$), the table has $2^{16}$ entries, each with 32 bits, i.e., four 8-bit elements. Thus, the table takes up a great deal of storage space and requires a relatively complex addressing scheme.

A system using the matrix manipulation method produces an $2^m$-by-$2^m$ matrix, by determining $f(\alpha)$, $f(\alpha^1)$, $f(\alpha^2)$ . . . $f(.\alpha^{(2^m-1)})$, where $f(x)=x^4+x^2+ax+b$. It next manipulates the matrix to determine the null space of the space spanned by the matrix. The roots of the polynomial can then be obtained from the vectors that span the null space. [For a more detailed description see, E. R. Berlekamp, *Algebraic Coding Theory*, McGraw Hill Book Company, 1968]. This method requires bit-by-bit manipulation of an 2 m-by-2 m matrix and typically requires numerous manipulation operations to transform the matrix. Thus, it is time consuming and computation intensive.

The inventive system described herein reduces the time it takes to find four error locations, which involves determining the roots of the degree-four polynomial. The system makes use of a well known method of determining the roots of a degree-two polynomial, as described by Berlekamp in *Algebraic Coding Theory*. Further, the system makes use of a method of determining the roots of a degree-three polynomial that is described by Van der Horst and Berger in *Complete DeCoding of Triple-Error-Correcting Binary BCH CodOes*, IEEE Transactions on Information Theory, Vol. IT-22, pp. 138–147, 1976. Van der Horst and Berger have established that the method works for GF($2^{2m}$) for m=2 and 3. I have determined that the method works for atleast GF($2^{2m}$) for m=4, 5 and 6.

Finding the roots of the degree-three polynomial in accordance with the teachings of Van der Horst and Berger requires determining a cubic root of a Galois field element over GF($2^{2m}$). As discussed later herein, I have developed an inventive circuit for relatively quickly and easily finding the cubic roots.

SUMMARY OF THE INVENTION

The invention is a system that determines the error locations of four errors in GF($2^{2m}$) by transforming a degree-four error locator polynomial ultimately into two quadratic equations, finding the solutions of these equations, and from these solutions determining the roots of the error locator polynomial.

More specifically, the system first manipulates the degree-four polynomial:

$$\sigma(x)=\sigma_4 x^4+\sigma_3 x^3+\sigma_2 x^2+\sigma_1 x+\sigma_0 \qquad [1]$$

into the form:

$$\theta(y)=y^4+\theta_2 y^2+\theta_1 y+\theta_0 \qquad [2]$$

where the $\theta_i$'s are combinations of the coefficients of the terms of the error locator polynomial.
Note that the coefficient of the $y^3$ term is zero.
The system then factors $\theta(y)$ into:

$$\theta(y)=(y^2+t^*y+u)^*(y^2+v^*y+w), \qquad [3]$$

where "*" represents multiplication, and expands the expression to:

$$\theta(y)=y^4+(t+v)y^3+(t^*v+u+w)y^2+(t^*w+v^*u)y+u^*w, \qquad [4]$$

where t, u, v and w are unknown. Equating the coefficients of expressions 2 and 3, the system determines that:

$$\begin{aligned} t+v &= 0 \\ t^*v+u^*w &= t^2+u^*w = \theta_2 \\ t^*w+u^*v &= t+w+t^*u = t^*(x+u) = \theta_1 \\ u^*w &= \theta_0. \end{aligned} \qquad [5]$$

The system then produces an equation with the variable t as the only unknown:

$$t^3+\theta_2 t+\theta_1=0 \qquad [6]$$

This degree-three equation can be solved using the method described by Van der Horst and Berger, as discussed in more detail below.

Once a root, $t_0$, of equation 6 is determined, the root is substituted into the expression for $\theta_1$, and that expression and the expression for $\theta_0$ are used to from a quadratic equation with u and w as the roots:

$$p^2+(\theta_2+t_0^2)p+\theta_0=0 \qquad [7]$$

The system then finds the roots, $p_0$ and $p_1$, of equation 7, using Berlekamp's method for solving degree-two polynomials. The roots $p_0$ and $p_1$, which are u and w, respectively, are substituted into polynomial 3 and each term is set to zero, to produce two quadratic equations:

$$y^2+t_0^*y+p_0=0$$

$$y^2+t_0^*y+p_1=0 \qquad [8]$$

The roots of equations 8, which are determined using the Berlekamp method, are also the roots of $\theta(y)$, and they can thus be used directly to produce the roots of the error locator polynomial.

This direct solution is faster than the prior trial and error or the matrix manipulation methods of finding the four roots. Further, it does not require the storage of and entry into the large look-up table that is required in other prior known systems.

BRIEF DESCRIPTION OF THE DRAWINGS

For a fuller understanding of the nature and objects of the invention, reference should be had to the following detailed description taken in connection with the accompanying drawings, in which.

DESCRIPTION OF THE PREFERRED EMBODIMENT

The mathematical operations of addition, subtraction, multiplication and division discussed herein are Galois Field operations over $GF(2^{2m})$.

Figure 1:
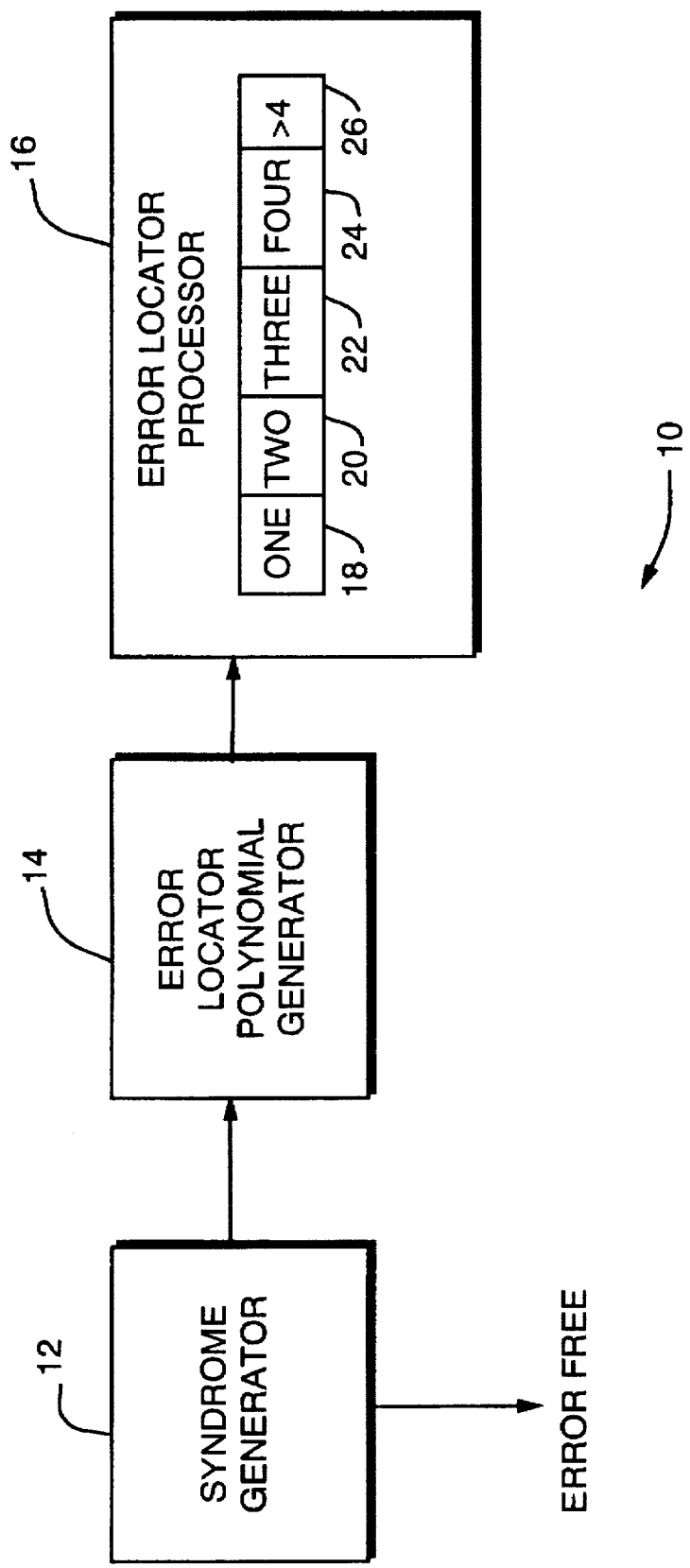
FIG. 1 is a functional block diagram of a decoder that is constructed in accordance with the invention.

Referring now to FIG. 1, a decoder 10 includes a iyndrome generator 12 that operates in a conventional manner to produce an associated set of error syndromes. If the syndromes are all zero, the syndrome generator 12 determines that the code word is error-free. Otherwise, the syndrome generator sends the syndromes to an error locator polynomial generator 14, which produces in a conventional manner from the syndromes an error locator polynomial of degree "e", where e is the number of errors in the code word. The error locator polynomial generator 14 then sends the error locator polynomial to an error locator processor 16, which selects and implements an appropriate process for determining the roots of the error locator polynomial, and thus, the error locations. FIG. 1 depicts these processes as various blocks or processors, namely, a processor 18 for determining one error location, a processor 20 for determining two error locations, a processor 22 for determining three error locations, a processor 24 for determining four error locations, and a processor 26 for determining more than four error locations.

The two-, three- and four-error processors 20, 22 and 24 are interconnected. As discussed below, the error locator processor 16 reduces the time it takes to determine the locations of three and four errors by transforming the corresponding error location polynomials ultimately into associated sets of quadratic equations. To do this, the four-error processor 24 makes use of both the three-error processor 22 and the two-error processor 20. Similarly, the three-error processor 22 makes use of the two-error processor 20. While these processes are depicted as occurring in separate, dedicated processors, they may be performed in one or more multi-purpose processors.

The error locator processor 16 determines the locations of one and two errors in a conventiohal manner. It determines the locations of three errors in accordance with the method described by Van der Horst and Berger. However, it uses an inventive circuit to perform a necessary step of determining the cubic root of a Galois Field element. This circuit and the method of determining the three error locations are discussed below with reference to FIGS. 2 and 3.

The error locator processor 16 determines the locations of four errors using a unique process that is described below with reference to FIG. 4. Before describing this process, the two- and three-error location processes are discussed in Sections A and B, respectively.

A. DETERMINING TWO ERROR LOCATIONS

If the code word contains two errors, the error locator polynomial is of the form:

$$\sigma(x) = \sigma_2 x^2 + \sigma_1 x + \sigma_0 x \quad [1]$$

To find the roots of the polynomial, the system sets the polynomial equal to zero:

$$\sigma(x) = \sigma_2 x^2 + \sigma_1 x + \sigma_0 x = 0 \quad [2]$$

and solves the equation for the solutions, $x_0$ and $x_1$.

To solve equation 2, the error locator processor 16 transforms the equation into the form:

$$y^2 + y + C = 0 \quad [3]$$

by changing the variable to:

$$x = \frac{\sigma_1}{\sigma_2} y \quad [4]$$

such that equation 2 becomes $$\sigma\left(\frac{\sigma_1}{\sigma_2} y\right) = \frac{\sigma_1^2}{\sigma_2} y^2 + \frac{\sigma_1^2}{\sigma_2} y + \sigma_0$$

Then, dividing by $$\frac{\sigma_2}{\sigma_1^2},$$

the system produces the equation:

$$y^2 + y + \frac{\sigma_0 \sigma_2}{\sigma_1^2} = 0 \quad [5]$$

and the C of equation 3 is thus $$\frac{\sigma_0 \sigma_2}{\sigma_1^2}.$$

For a solution of equation 5 to exist in $GF(2^{2m})$, the "traces" of both sides of the equation must be the same. A trace is defined as:

$$\text{Trace}(\alpha^i) = \sum_{k=0}^{2m-1} (\alpha^i)^{2^k} \quad [6]$$

The Trace (0) equals 0, and thus, for solutions to exist within the Galois Field, $$\text{Trace } [y^2 + y + C] = 0 \quad [7]$$

The trace of a sum of terms is equal to the sum of the traces of the individual terms. In $GF(2^{2m})$, Trace $(y^2)$=Trace $(y)$ and their sum, using Galois Field addition, is zero. Accordingly, equation 5 has a solution in $GF(2^{2m})$ if Trace $(C)=0$.

The general solution to equation 5 is a linear combination of 2m-1 "base solutions". A base solution is a solution to equation 3 with C as one of the "base elements" $C_1, C_2 \ldots C_{2m-1}$ of the Galois Field. The base elements are those elements of the field that can be linearly combined to produce all of the other elements of the field. These elements may, for example, be the set of 2m-1 elements that each include 2m-1 zeros and a single 1, i.e., $\alpha^i=000 \ldots 1$ to $\alpha^j=100 \ldots 00$. In such a field, $C=00110 \ldots 0$ is a linear combination of base elements $00100 \ldots 0$ and $00010 \ldots 0$. The general solution to equation 5 is the linear combination of the base solutions that correspond to the base elements which are summed to produce $$\frac{\sigma_0 \sigma_2}{\sigma_1^2}.$$

In $GF(2^4)$ which is defined by the generator polynomial $x^4+x+1$, each element, $\alpha^i$, that has a trace of zero also has a zero as its most significant bit. Accordingly, the C's of interest in this field are combinations of the base elements $\alpha^0=0001$, $\alpha^1=0010$ and $\alpha^2=0100$. The corresponding base solutions are:

$$(\alpha^5)^2 + \alpha^5 = \alpha^0 \quad \text{with } y_0 = \alpha^5$$
$$(\alpha^9)^2 + \alpha^9 = \alpha^1 \quad \text{with } y_0 = \alpha^9$$
$$(\alpha^3)^2 + \alpha^3 = \alpha^2 \quad \text{with } y_0 = \alpha^3$$

Another set of base solutions are:

$$(\alpha^{10})^2 + \alpha^{10} = \alpha^0 \quad \text{with } y_1 = \alpha^{10}$$
$$(\alpha^7)^2 + \alpha^7 = \alpha^1 \quad \text{with } y_1 = \alpha^7$$
$$(\alpha^{14})^2 + \alpha^{14} = \alpha^2 \quad \text{with } y_1 = \alpha^{14}$$

In this Galois Field, the solutions for equation 3 with C equal to $\alpha^8=0101$, for example, are determined by decomposing C into:

$$C = \alpha^0 + \alpha^2 = 0001 + 0100$$

and summing a corresponding set of base solutions, for example:

$$y_0 = \alpha^5 + \alpha^3 = \alpha^{11}$$

to produce a first root and determining a second root as:

$$y_1 = y_0 + \alpha^0$$

Next, the system determines the roots of the degree-two error locator polynomial as:

$$x_0 = y_0 \left(\frac{\sigma_1}{\sigma_2}\right)$$

$$x_1 = y_1 \left(\frac{\sigma_1}{\sigma_2}\right).$$

B. DETERMINING THREE ERROR LOCATIONS

The error locator polynomial associated with three errors is of the form:

$$\sigma(x) = \sigma_3 x^3 + \sigma_2 x^2 + \sigma_1 x + \sigma_0 \quad [8]$$

To find the roots, the system sets the polynomial equal to zero:

$$\sigma(x) = \sigma_3 x^3 + \sigma_2 x^2 + \sigma_1 x + \sigma_0 = 0 \quad [9]$$

and transforms the equation into the form:

$$y^3 + ay + b = 0$$

To do this, the system makes a change of variable:

$$x = y + \frac{\sigma_2}{\sigma_3}$$

and equation 9 becomes $$\sigma\left(y + \frac{\sigma_2}{\sigma_3}\right) = \sigma_3\left(y + \frac{\sigma_2}{\sigma_3}\right)^3 + \sigma_2\left(y + \frac{\sigma_2}{\sigma_3}\right)^2 + \sigma_1\left(y + \frac{\sigma_2}{\sigma_3}\right) + \sigma_0 = 0. \quad [10]$$

The system next expands the terms of equation 10:

$$\sigma_3\left(y^3 + y^2\frac{\sigma_2}{\sigma_3} + y\left(\frac{\sigma_2}{\sigma_3}\right)^2 + \left(\frac{\sigma_2}{\sigma_3}\right)^3\right) + \sigma_2\left(y^2 + \left(\frac{\sigma_2}{\sigma_3}\right)^2\right) + \sigma_1\left(y + \frac{\sigma_2}{\sigma_3}\right) + \sigma_0 = 0$$

and collects like terms to produce:

$$\sigma_3 y^3 + (\sigma_2 + \sigma_2)y^2 + \left(\frac{\sigma_2^2}{\sigma_3} + \sigma_1\right)y + \frac{\sigma_2^3}{\sigma_3^2} + \frac{\sigma_2^3}{\sigma_3^2} + \frac{\sigma_1\sigma_2}{\sigma_3} + \sigma_0 = 0 \quad [11]$$

In $GF(2^{2m})$ the summing of two identical terms equals zero, and the equation becomes:

$$\sigma_3 y^3 + 0y^2 + \left(\frac{\sigma_2^2}{\sigma_3} + \sigma_1\right)y + 0 + \frac{\sigma_1\sigma_2}{\sigma_3} + \sigma_0 = 0 \quad [12]$$

The system divides equation 12 by $\sigma_3$, to produce an equation of the form:

$$y^3 + ay + b = 0 \quad [13]$$

with $$a = \frac{\sigma_2^2}{\sigma_3^2} + \frac{\sigma_1}{\sigma_3} \text{ and } b = \frac{\sigma_0}{\sigma_3} + \frac{\sigma_1\sigma_2}{\sigma_3^2}.$$

If $a \neq 0$, the system changes variable to:

$$y = z + \frac{a}{z} \quad [14]$$

and equation 13 becomes $$\left(z + \frac{a}{z}\right)^3 + a\left(z + \frac{a}{z}\right) + b = 0. \quad [15]$$

It next expands equation 15 and collects like terms to produce:

$$z^3 + \frac{a}{z}z^2 + \left(\frac{a}{z}\right)^2 z + \left(\frac{a}{z}\right)^3 + az + \frac{a^2}{z} + b = $$
$$z^3 + az + \frac{a^2}{z} + \frac{a^3}{z^3} + az + \frac{a^2}{z} + b = z^3 + \frac{a^3}{z^3} + b = 0. \quad [16]$$

The system next multiplies equation 16 by $z^3$ to produce $$(z^3)^2 + bz^3 + \alpha = 0, \quad [17]$$

which is a quadratic equation with $z^3$ as the variable. Equation 17 can then be solved using the two-error method discussed in Section A.

Once one solution, $z_{03}$, is determined, the system uses a circuit that is described with reference to FIGS. 2 and 3 below to find the cubic root, $z_0$. A second solution, $z_1$ to equation 17 is:

$$z_1 = z_0 * \alpha^{\frac{2^{2m}-1}{3}}$$

where the exponent $$\frac{2^{2m}-1}{3}$$

is always an integer, since with m even $2^{2m}-1$ is divisible by 3. A third solution to equation 17 is:

$$z_2 = z_1 + z_0$$

The system next substitutes these solutions into the expression for y, and individually adds the results of the substitution to $$\frac{\sigma_2}{\sigma_3}$$

to produce the roots $x_0$, $x_1$ and $x_2$ of the degree-three error locator polynomial.

If $a=0$, the solution to equation 13 is $y=b^{1/3}$. To find the cubic root of b the system uses the circuit depicted in FIG. 2. Once the cubic root is known, the system determines $y_1$ and $y_2$ as:

$$y_1 = y_0 * \alpha^{\frac{2^{2m}-1}{3}} \text{ and}$$

$$y_2 = y_0 + y_1.$$

and from these values determines the roots $x_0$, $x_1$ and $x_2$.

Figure 2:
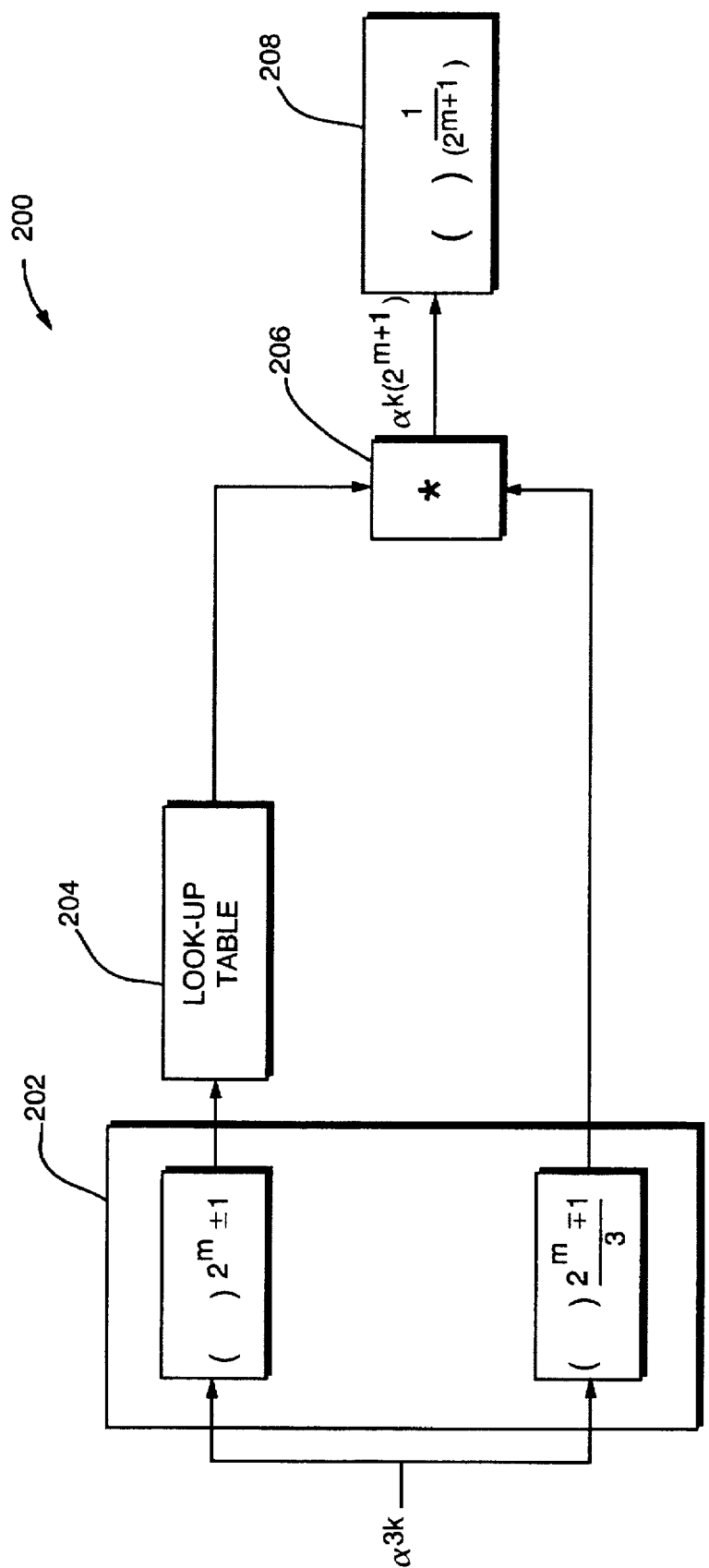
FIG. 2 is a functional block diagram of an inventive circuit for determining the cubic roots of $GF(2^{2m})$ elements.
Figure 3:
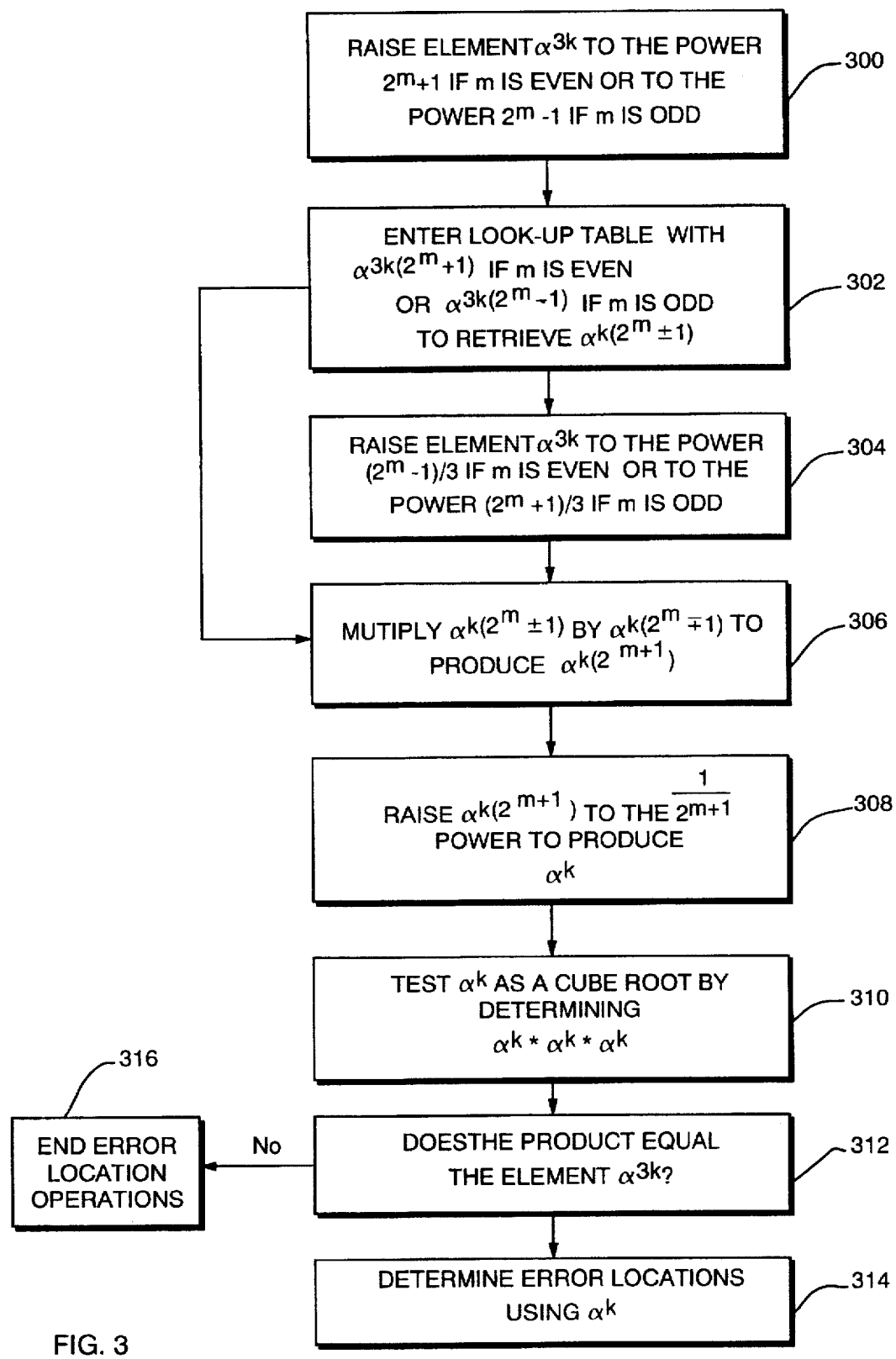
FIG. 3 is a flow chart of the operations of the circuit of FIG. 2.

Referring now to FIGS. 2 and 3, a circuit 200 finds the cubic root of an element $\alpha^{3k}$ of $GF(2^{2m})$ by raising the element to powers that are associated with $\alpha^{2^L}$. Raising any $GF(2^{2m})$ element to a power of $2^L$ is readily accomplished using a plurality of conventional Galois Field multipliers.

The circuit 200 takes advantage of the identity $x^2-1=(x-1)*(x+1)$. With x equal to $2^m$ the identity becomes $2^{2m}-1 = (2^m-1)*(2^m+1)$. One of the factors $2^m-1$ or $2^m+1$ is divisible by 3, but not both factors. If, for example, m=4, the factor $2^m-1$ is divisible by 3 and $2^m+1$ is not. The circuit 200 also takes advantage of the fact that $(\alpha^{2^m-1})*(\alpha^{2^m+1}) = \alpha^{2^{2m}-1}$.

Using the circuit 200, the Galois Field element $\alpha^{3k}$ is raised in multiplier 202 to the power that corresponds to the factor of the identity that is not divisible by three (step 300). In the example of m=4, the element is raised to the $2^m+1$ power. Then, a look-up table 204 is used to find the cubic root $\alpha^{k(2^m+1)}$, of the product $\alpha^{3k(2^m+1)}$) (step 302). The table, which has entries only for the cubic roots of the possible products $\alpha^{k(2^m+1)}$), is relatively small. For the example of $GF(2^8)$ the table has just five entries.

The multiplier 202 also raises the element $\alpha^{3k}$ to a power that corresponds to $$\frac{2^m-1}{3}$$

(step 304), and the result is multiplied in GF multiplier 206 by the cubic root produced by the look-up table 204 (step 306):

$$\alpha^{k(2^m+1)} * \alpha^{k(2^m-1)} = \alpha^{k(2^{m+1})}.$$

In step 308, the system raises this product to the $$\frac{1}{2^{m+1}}$$

power, to produce the cube root $\alpha^k$.

Figure 4:
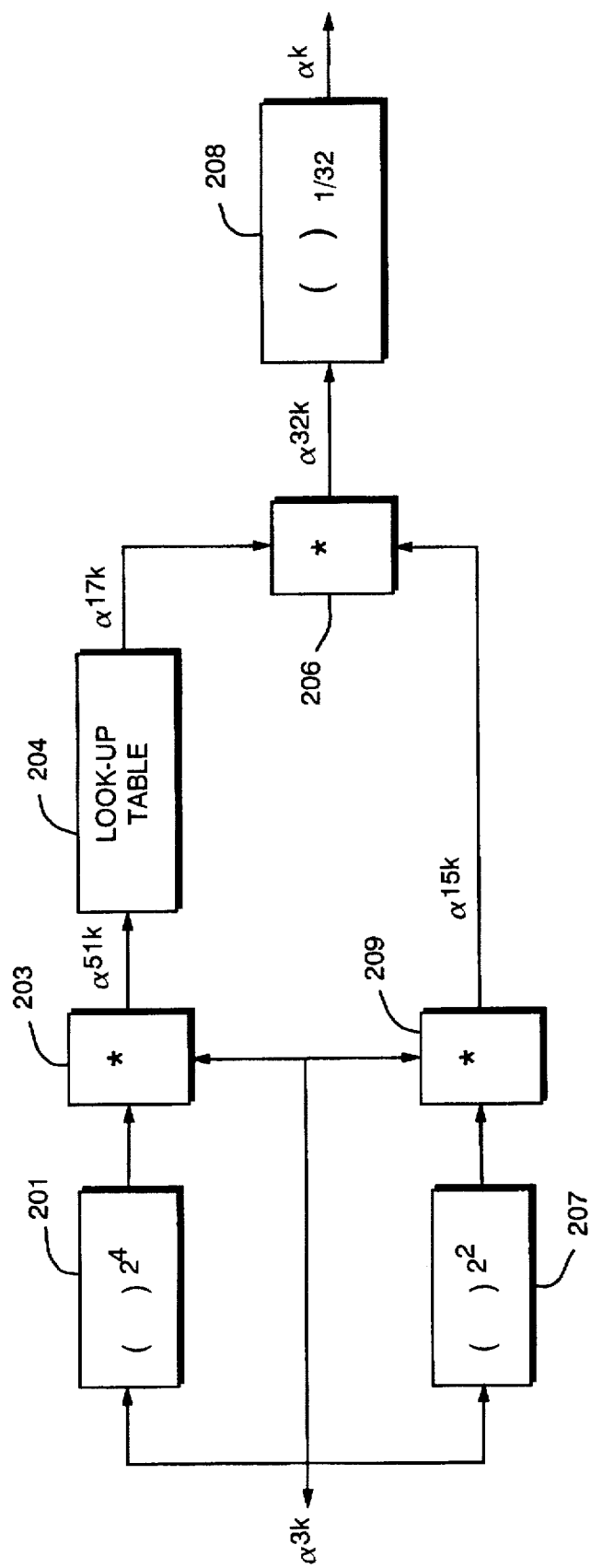
FIG. 4 is the circuit of FIG. 2 for $GF(2^8)$.

FIG. 4 depicts the circuit 200 for GF($2^8$), i.e., m=4. To raise $\alpha^{3k}$ to the $2^m+1$ power, the circuit, in GF multiplier 201, first raises the element to the $2^m$ or $2^4=16$ power. Then, in GF multiplier 203, the product $\alpha^{3k(16)}=\alpha^{48k}$ is multiplied by the element $\alpha^{3k}$, to produce the product $\alpha^{3k(2^m+1)}=\alpha^{51k}$. This product is used to enter the five-element lookup table 204:

$$\alpha^0 \to \alpha^0$$

$$\alpha^{51} \to \alpha^{17}$$

$$\alpha^{102} \to \alpha^{34}$$

$$\alpha^{153} \to \alpha^{51}$$

$$\alpha^{204} \to \alpha^{68}$$

which produces $\alpha^{17k}$.

Using GF multipliers 207 and 209, the element $\alpha^{3k}$ is raised to the $$\left(\frac{2^m-1}{3}\right) \text{ or } \frac{2^4-1}{3} = 5$$

power. The GF multiplier 207 first raises the element to the $2^2$ or 4 power and GF multiplier 209 multiplies the product $\alpha^{3k(4)}=\alpha^{12k}$ by the element $\alpha^{3k}$ to produce the product $\alpha^{15k}$.

The GF multiplier 206 then multiplies the two products $\alpha^{17k} * \alpha^{15k} = \alpha^{32k}$. The result is next raised to the $$\frac{1}{2^{m+1}} \text{ or } \frac{1}{2^5} = \frac{1}{32}$$

power in multiplier 210, to produce the cube root, $\alpha^k$.

The circuit 200 produces a result for every element that is applied to it. However, there are not necessarily cubic roots for every element of the Galois Field. Accordingly, the system must test the result (step 310) to determine if the result is an actual cube root. The system thus multiplies the result by itself twice and determines if the product equals the element that was applied to the circuit (step 312). If so, the cube root is accurate and the error locations can be determined (step 314). If, however, the product does not equal the element, the system determines that the error locations cannot be found (step 316). The system then ends the process of finding the error locations.

C. DETERMINING FOUR ERROR LOCATIONS

The error locator polynomial associated with four errors is of the form:

$$\sigma(x)=\sigma_4 x^4+\sigma_3 x^3+\sigma_2 x^2+\sigma_1 x+\sigma_0. \quad [18]$$

To find the roots, the system sets the polynomial equal to zero:

$$\sigma(x)=\sigma_4 x^4+\sigma_3 x^3+\sigma_2 x^2+\sigma_1 x+\sigma_0=0 \quad [19]$$

and transforms the equation into the form:

$$y^4+dy^2+ey+h=0.$$

Figure 5B:
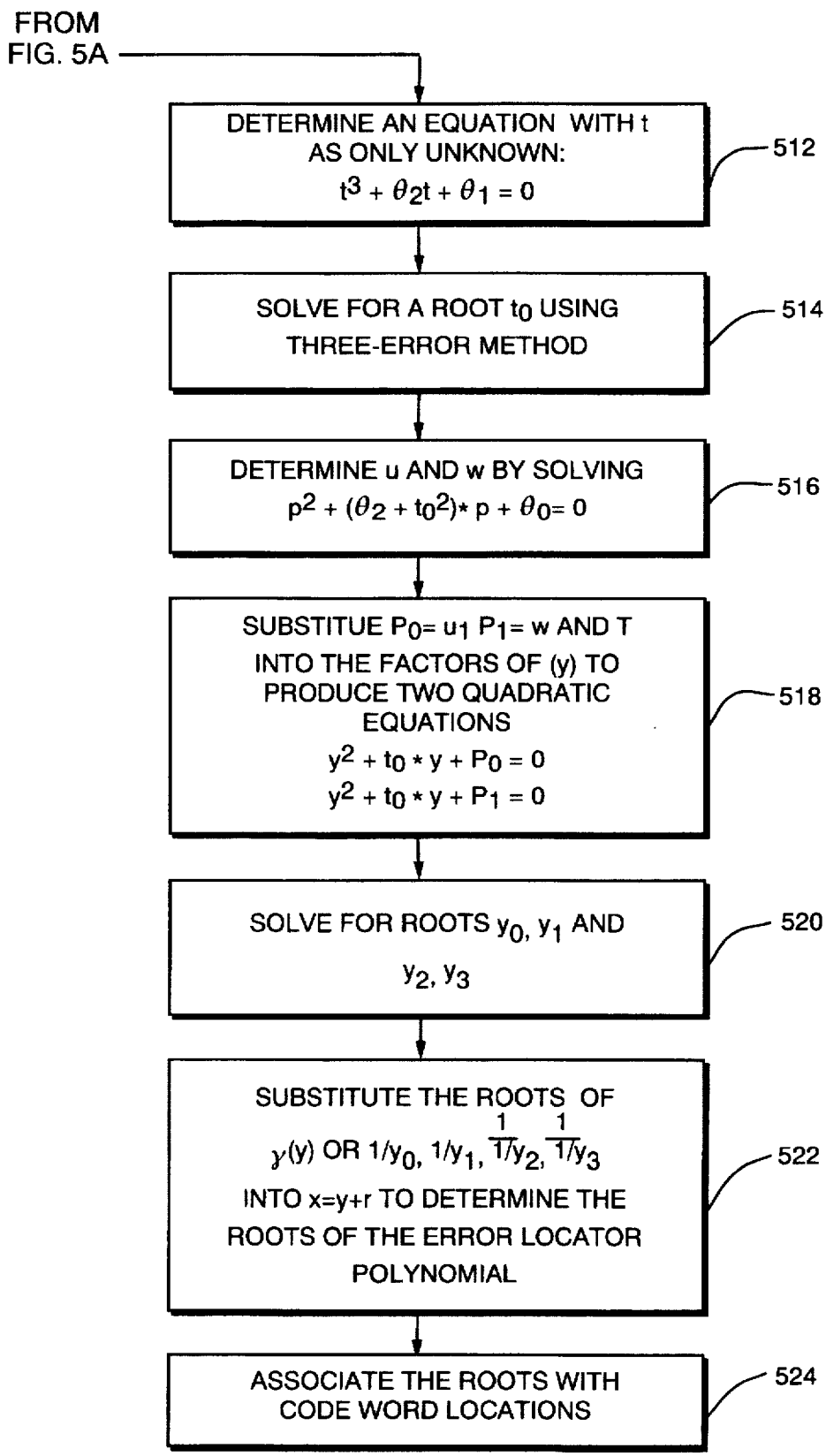
FIG. 5 is a flow char of the operations that the decoder of FIG. 1 performs when it determines the locations of four errors.

Specifically, referring now to FIG. 5, the system in step 500 makes a change of variable:

$x=y+r$, where $$r=\left(\frac{\sigma_1}{\sigma_3}\right)^{1/2}$$

and equation 19 becomes:

$$\gamma(y)=\sigma_4(y+r)^4+\sigma_3(y+r)^3+\sigma_2(y+r)^2+\sigma_1(y+r)+\sigma_0=0. \quad [20]$$

The system in step 502 expands terms:

$$\gamma(y)=\sigma_4(y^4+r^4)+\sigma_3(y^3+y^2r+yr^2+r^3)+\sigma_2(y^2+r^2)+\sigma_1(y+r)+\sigma_0=0$$

and collects like terms, to produce:

$$\gamma(y)=\sigma_4 y^4+\sigma_3 y^3+(\sigma_3 r+\sigma_2)y^2+(\sigma_3 r^2+\sigma_1)y+\sigma_4 r^4+\sigma_3 r^3+\sigma_2 r^2+\sigma_1 r+\sigma_0=0 \quad [21]$$

Next, in step 504 the system substitutes $$\left(\frac{\sigma_1}{\sigma_3}\right)^{1/2}$$

for r, and the coefficient of the linear term is zero, since $$\sigma_3\left[\left(\frac{\sigma_1}{\sigma_3}\right)^{1/2}\right]^2+\sigma_1=\sigma_1+\sigma_1=0.$$

Equation 21 thus becomes $$\sigma_4 y^4+\sigma_3 y^3+[(\sigma_3 * \sigma_1)^{1/2}+\sigma_2]y^2+s, \quad [22]$$

where "s" is the constant term of equation 21.

Instead of solving this equation directly, the system in step 506 finds the roots of $$\theta(y)=\frac{y^4 * \gamma\left(\frac{1}{y}\right)}{s}. \quad [23]$$

Accordingly, the system solves $$\theta(y)=\frac{y^4}{s}\left[\sigma_4\frac{1}{y^4}+\sigma_3\frac{1}{y^3}+[(\sigma_3 * \sigma_1)^{1/2}+\sigma_2]\frac{1}{y^2}\right]+s \quad [24]$$

or $$\theta(y)=y^4+\theta_2 y^2+\theta_1 y+\theta_0=0 \quad [25]$$

where $$\theta_2=\frac{(\sigma_3 * \sigma_1)^{1/2}+\sigma_2}{s}$$

$$\theta_1=\frac{\sigma_3}{s}$$

$$\theta_0=\frac{\sigma_4}{s}.$$

The system in step 508 first factors equation 25 into:

$$\theta(y)=(y^2+t*y+u)*(y^2+v*y+w)=0. \quad [26]$$

This assumes that equation 25 can be factored, which is a valid assumption if the roots to the error locator polynomial exist in GF($2^{2m}$).

The system expands the terms of equation 26 to:

$$\theta(y)=y^4+(t+v)y^3+(t*v+u+w)y^2+(t*w+v*u)y+u*w=0 \quad [27]$$

and sets the coefficients of this equation equal to those of equation 25 (step 510):

$t + v = 0$ $t*v + u + w = \theta_2$ $t*w + v*u = \theta_1$ $u*w = \theta_0$

Thus, $t = v$ $t^2 + (u + w) = \theta_2$ $t*(w + u) = \theta_1$ $u*w = \theta_0$ The system in step 512 next determines an equation with "t" as the only unknown. Recall that $\theta_2$, $\theta_1$ and $\theta_0$ are known, since they are combinations of the coefficients of the error locator polynomial. Accordingly, the system produces the equation:

$t^3 + \theta_2 t + \theta_1 = 0$     [28]

by setting $$u + w = \frac{\theta_1}{t},$$

substituting this into the expression for $\theta_2$ and multiplying by t.

The result is a degree-three polynomial that can be solved using the operations described in Section B above (step 514). Specifically, the system changes variable:

$$t = z + \frac{a}{z}$$

where $\alpha = \theta_2$
and equation 28 becomes $$\left(z + \frac{a}{z}\right)^3 + a\left(z + \frac{a}{z}\right) + \theta_1 = 0$$

Expanding and collecting terms $$z^3 + \left(\frac{a}{z}\right)^2 z + \frac{a}{z} z^2 + \left(\frac{a}{z}\right)^3 + a_3 + \frac{a^2}{z} + \theta_1 =$$     [29]

$$z^3 + az + \frac{a^2}{z} + \frac{a^3}{z} + az + \frac{a^2}{z} + \theta_1 = z^3 + \frac{a^3}{z^3} + \theta_1 = 0$$

and multiplying by $z^3$, the system produces the equation $(z^3)^2 + \theta_1 z^3 + a^3 = 0,$ which is a quadratic equation with $z^3$ as the variable.

Using the method of Section A, the system finds the roots of equation 29.

The system thus changes variable to:

$z^3 = \theta_1 g$     [30]

and the quadratic equation becomes $\theta_1^2 g^2 + \theta_1^2 g + a^3 = 0$     [31]

or $$g^2 + g + \frac{a^3}{\theta_1^2} = 0$$

If the Trace $$\left(\frac{a^3}{\theta_1^2}\right) = 0,$$

the solutions for equation 31 exist in $GF(2^{2m})$. Assuming the solutions exist, they are determed by decomposing $$\frac{a^3}{\theta_1^2} = \frac{\theta_2^2}{\theta_1^2}$$

into a linear combination of base elements, and associating with the base elemems the corresponding base solutions.

Once the solutions are determined, the system substitutes one of them, for example, $g_0$, into the expression 30 for $z^3$ and uses the circuit of FIG. 2 to determine the cubic root, $z_0$, of $z^3$. The system then determines $t_0$ from the expression:

$$t = z + \frac{a}{z}$$     [32]

with $z_0$ substituted for z.

To determine w and u, the system in step 516 uses the value $t_0$ and the expressions:

$t^2 + (u+w) = \theta_2$ and $u*w = \theta_0$ to produce a quadratic equation 33 that has u and w as its roots:

$(p + u)*(p + w) =$     [33]

$p^2 + (u + w)*p + (u*w) = p^2 + (\theta_2 + t_0^2)*p + \theta_0 = 0,$

The system then determines the solutions of equation 33 using the method of Section A. It next in step 518 substitutes these solutions, $p_0$ and $p_1$, into the factors of equation 26 to produce the quadratic equations:

$y^2 + t_0*y + p_0 = 0$ and $y^2 + t_0*y + p_1 = 0,$     [34]

and in step 520 solves for the roots $y_0$, $y_1$ and $y_2$, $y_3$ using the method of Section A. The roots $y_0$, $y_1$, $y_2$ and $y_3$ of equations 33 are the roots of $\theta(y)$, and $1/y_0$, $1/y_1$, $1/y_2$ and $1/y_3$ are the roots of $\gamma(y)$. The system in step 522 then substitutes $1/y_0$, . . . $1/y_3$ into the expression $x = y + r$, to determine the roots of the degree-four error locator polynomial. Finally, the system in step 524 associates the roots of the error locator polynomial with locations in the code word.

This direct method of determining the roots of the degree-four error locator polynomial is faster than performing a Chien Search or manipulating a 2 m-by-2 m matrix. Further, it does not require the large look-up table that is used by the other prior known systems.

What is claimed is:

1. A method of determining locations of four errors in a code word of a Reed-Solomon or BCH code, the method including the steps of:

a. manipulating a degree-four error locator polynomial $$\sigma(x)=\sigma_4 x^4+\sigma_3 x^3+\sigma_2 x^2+\sigma_1 x^1+\sigma_0$$

to produce a polynomial of the form:

$$\theta(y)=y^4+\theta_2 y^2+\theta_1 y+\theta_0;$$

b. factoring the polynomial into $$\theta(y)=(y^2+r^*y+u)*(y^2+v^*y+w);$$

c. equating the coefficients of the polynomials of steps a and b $$r+v=0$$

$$r^*v+u+w=\theta_2$$

$$r^*w+v^*u=\theta_1$$

$$u^*w=\theta_0;$$

h. determining an equation with t as the only unknown:

$$t^3+\theta_2 t+\theta_1=0$$

e. solving for a root $t_0$;

f. forming a quadratic equation with u and w as roots:

$$p^2+(\theta_2+t_0^2)p+\theta_0 0$$

g. solving for the roots $p_0$ and $p_1$;

h. substituting the roots into $\theta(y)$ and determining the roots of a pair of quadratic equations:

$$y^2+t_0^*y+p_1=0$$

$$y^2+t_0^*y+p_0=0;$$

i. associating the roots $y_0$, $y_1$ and $y_2$, $y_3$ of the pair of quadratic equations with the roots of the degree-four error locator polynomial; and j. associating the roots of the degree-four error locator polynomial with locations in the code word.

2. The method of claim 1, wherein the step of solving for a root of $$t^3+\theta_2 t+\theta_1=0$$

includes:

i. changing variable to $$t=z+\frac{a}{z},$$

where $a=\theta_2$, to produce an equation of the form $$z^3+\frac{a^3}{z^3}+\theta_1=0;$$

ii. multiplying the equation of step i by $z^3$ to obtain a quadratic equation with $z^3$ as the variable:

$$(z^3)^2+\theta_1 z^3+a^3=0;$$

iii. solving the quadratic equation of step ii for $z^3$;
   iv. determining the cube root, $z_0$, of $z^3$; and
   v. substituting the value of $z_0$ into the expression $$t=z+\frac{a}{z}.$$

3. The method of claim 1 wherein the step of transforming the error locator polynomial into $\theta(y)$ includes:

i. changing variable to x=y+r, where $$r=\left(\frac{\sigma_1}{\sigma_3}\right)^{1/2},$$

and expanding and collecting terms to produce an equation of the form:

$$\gamma(y)=\sigma_4 y^4+\sigma_3 y^3+(\sigma_3 r+\sigma_2)y^2+(\sigma_3 r^2+\sigma_1)y+\sigma_4 r^4+\sigma_3 r^3+\sigma_2 r^2+\sigma_1 r+\sigma_0=0$$

ii. substituting $$r=\left(\frac{\sigma_1}{\sigma_3}\right)^{1/2},$$

into the equation of step i to produce an equation of the form:

$$\gamma(y)=\sigma_4 y^4+\sigma_3 y^3+[(\sigma_3^*\sigma_1)^{1/2}+\sigma_2]y^2+s,$$

where s is the constant term of the equation of step i;

iii. finding the roots of:

$$\theta(y)=\frac{y^{4*}\gamma\left(\frac{1}{y}\right)}{s},$$

which expands to $$\theta(y)=y^4+\theta_2 y^2+\theta_1 y+\theta_2=0$$

where $$\theta_2=\frac{(\sigma_3^*\sigma_1)^{1/2}+\sigma_2}{s}$$

$$\theta_1=\frac{\sigma_3}{s} \text{ and}$$

$$\theta_0=\frac{\sigma_4}{s}.$$

4. A method of determining locations of four errors in a code word of a Reed-Solomon or BCH code, the method including the steps of:

a. manipulating a degree-four error locator polynomial $$\sigma(x)=\sigma_4 x^4+\sigma_3 x^3+\sigma_2 x^2+\sigma_1 x^1+\sigma_0$$

by
   i. changing variable to x=y+r, where $$r=\left(\frac{\sigma_1}{\sigma_3}\right)^{1/2},$$

and expanding and collecting terms to produce an equation of the form:

$\gamma(y)=\sigma_4 y^4+\sigma_3 y^3+(\sigma_3 r+\sigma_2)y^2+(\sigma_3 r^2 \sigma_1)y+\sigma_4 r^4+\sigma_3 r^3+\sigma_2 r^2+\sigma_1 r+\sigma_0=0;$ ii. substituting $$r=\left(\frac{\sigma_1}{\sigma_3}\right)^{1/2},$$

into the equation of step i to produce an equation of the form:

$\gamma(y)=\sigma_4 y^4+\sigma_3 y^3+\{(\sigma_3 * \sigma_1)^{1/2}+\sigma_2\}y^2+s,$ where s is the constant term of the equation of step i;

iii. finding the roots of:

$$\theta(y)=\frac{y^4 * \gamma\left(\frac{1}{y}\right)}{s},$$

which expands to $\theta(y)=y^4+\theta_2 y^2+\theta_1 y+\theta_0=0$ where $$\theta_2=\frac{(\sigma_3 * \sigma_1)^{1/2}+\sigma_2}{s}$$

$$\theta_1=\frac{\sigma_3}{s} \text{ and}$$

$$\theta_0=\frac{\sigma_4}{s};$$

b. factoring $\theta(y)=(y^2+r*y+u)*(y^2+v*y+w);$ c. determining the values of t,u, v and w;
d. substituting the values t, u, v and w into $\theta(y)$ and determining the roots of a pair of quadratic equations:

$y^2+t*y+u=0$ $y^2+v*y+w=0;$ e. associating the roots $y_0$, $y_1$ and $y_2$, $y_3$ of the pair of quadratic equations with the roots of the degree-four error locator polynomial; and
f. associating the roots of the degree-four error locator polynomial with locations in the code word.

5. The method of claim 4, wherein the step of determining the values of t,u, v and w includes the steps of:

i. equating the coefficients of the polynomials of steps a and b:

$t+v=0$ $t*v+u+w=\theta_2$ $t*w+v*u=\theta_1$ $u*w=\theta_0;$ ii determining an equation with t as the only unknown:

$t^3+\theta_2 t+\theta_1=0$ iii. solving for a root $t_0$;
iv. forming a quadratic equation with u and w as roots:

$p^2+(\theta_2+t_0^2)p+\theta_0=0$ v. solving for the roots $p_0$ and $p_1$, which are u and w.

6. The method of claim 5, wherein the step of solving for a root of $t^3+\theta_2 t+\theta_1=0$ includes:

a. changing variabel to $$t=z+\frac{a}{z},$$

where $a=\theta_2$, to produce an equation of the form $$z^3+\frac{a^3}{z^3}+\theta_1=0;$$

b. multiplying the equation of step a by $z^3$ to obtain a quadratic equation with $z^3$ as the variable:

$(z^3)^2+\theta_1 z^3+a^3=0;$ c. solving the quadratic equation of step b for $z^3$;
d. determining the cube root, $z_0$, of $z^3$; and
e. substituting the value of $z_0$ into the expression $$t=z+\frac{a}{z}.$$

* * * * *